(12) United States Patent
McGaughy

(10) Patent No.: US 8,819,086 B2
(45) Date of Patent: Aug. 26, 2014

(54) NAMING METHODOLOGIES FOR A HIERARCHICAL SYSTEM

(71) Applicant: Proplus Electronics Co., Ltd., San Jose, CA (US)

(72) Inventor: Bruce McGaughy, Pleasanton, CA (US)

(73) Assignee: Proplus Electronics Co., Ltd., Jinan, Shandong (CN)

( * ) Notice: Subject to any disclaimer, the term of this patent is extended or adjusted under 35 U.S.C. 154(b) by 133 days.

(21) Appl. No.: 13/645,870

(22) Filed: Oct. 5, 2012

(65) Prior Publication Data

US 2014/0101153 A1   Apr. 10, 2014

(51) Int. Cl.
*G06F 17/30*   (2006.01)

(52) U.S. Cl.
USPC ........... 707/809; 707/830; 707/741; 707/802; 707/829

(58) Field of Classification Search
CPC ............ G06F 17/5022; G06F 17/5009; G06F 17/3028; G06F 17/30911; G06F 17/5045
USPC ............... 703/17, 14, 16; 716/106, 102, 103; 707/802, 999.102, E17.044, E17.123
See application file for complete search history.

(56) References Cited

U.S. PATENT DOCUMENTS

| | | | | |
|---|---|---|---|---|
| 5,949,691 A * | 9/1999 | Kurosaka et al. | 716/103 |
| 6,530,072 B1 * | 3/2003 | Hagerman et al. | 716/103 |
| 7,181,383 B1 * | 2/2007 | McGaughy et al. | 703/14 |
| 7,272,805 B2 * | 9/2007 | McGaughy et al. | 716/103 |
| 7,523,424 B2 * | 4/2009 | Kolpekwar et al. | 716/103 |
| 8,233,768 B2 * | 7/2012 | Soroushian et al. | 386/241 |
| 8,397,190 B2 * | 3/2013 | Kenney et al. | 716/106 |
| 2006/0112356 A1 * | 5/2006 | McGaughy et al. | 716/3 |
| 2007/0124706 A1 * | 5/2007 | Kolpekwar et al. | 716/1 |
| 2009/0171896 A1 * | 7/2009 | Hackmann et al. | 707/3 |
| 2012/0192132 A1 * | 7/2012 | Kenney et al. | 716/105 |

* cited by examiner

*Primary Examiner* — Debbie Le
(74) *Attorney, Agent, or Firm* — Silicon Valley Patent Group LLP

(57) ABSTRACT

Methods and systems are disclosed for naming methodologies for a hierarchical system. In one embodiment, a computer implemented method of organizing instance names in a hierarchical system includes receiving a description of a hierarchical system that includes plurality of instances arranged in different branches in a plurality of hierarchical levels in a physical data structure, creating an instance name data structure configured to describe the corresponding instances in the hierarchical system, where the instance name data structure comprises a map of indexes and a corresponding array of offsets configured to access naming information in a subsequent level, and associating names of instances in the hierarchical system to a corresponding set of unique integers which are arranged in a sequential manner.

19 Claims, 8 Drawing Sheets

NAMING METHODOLOGIES FOR A HIERARCHICAL SYSTEM

FIELD OF THE INVENTION

The present invention relates to the field of electronic design automation tools. In particular, the present invention relates to naming methodologies for a hierarchical system.

BACKGROUND OF THE INVENTION

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc.

The development of complicated integrated circuits often requires the use of powerful numerical simulation programs. For example, circuit simulation is an essential part in the design flow of integrated circuits, helping circuit designers to verify the functionality and performance of their designs without going through expensive fabrication processes. As the semiconductor processing technology migrates to nanometer dimensions, new simulation methodologies are needed to solve the new problems intrinsically existing in circuit design with nanometer features. Modern integrated circuits continually challenge circuit simulation algorithms and implementations in the development of new technology generations. The semiconductor industry requires EDA software with the ability to analyze nanometer effects like coupling noise, ground bounce, transmission line wave propagation, dynamic leakage current, supply voltage drop, and nonlinear device and circuit behavior, which are all related to dynamic current. Thus, detailed circuit simulation and transistor-level simulation have become one of the most effective ways to investigate and resolve issues with nanometer designs.

Examples of electronic circuit simulators include the Simulation Program with Integrated Circuit Emphasis (SPICE) developed at the University of California, Berkeley (UC Berkeley), and various enhanced versions or derivatives of SPICE. SPICE and its derivatives or enhanced versions will be referred to hereafter as SPICE circuit simulators, or SPICE. The SPICE method considers a circuit as a non-divided object.

SPICE-like simulations may provide fairly accurate predictions of how corresponding circuits will behave when actually built. The predictions are preferably made not only for individual sub-circuit but also for whole systems (e.g., whole integrated circuits) so that system-wide problems relating to noise and the like may be uncovered and dealt with. In a general process flow of a SPICE-like simulation, an analog integrated circuit under simulation is often represented in the form of a netlist description. A netlist is a circuit description of the analog circuit to be simulated written in a SPICE-like language. SPICE netlists are pure structural languages with simulation control statements. Other language like Verilog-A™ has the capability to include behavioral constructs. The structural netlist of SPICE together with a predefined set of circuit components of the analog integrated circuit may be represented in the form of a matrix in accordance with certain circuit modeling methodologies. The number of non-linear differential equations ranges from 1 to n. There are a corresponding number of input vectors to be operated by the linear equation. The set of input vectors are shown as $\{I_1, I_2, \ldots I_n\}$. Next, the linear matrix is computed with the set of input vectors to generate a set of solution vectors $\{V_1, V_2, \ldots V_n\}$. The computation is repeated until the set of solutions converge. The set of solutions may be then displayed in the form of waveforms, measurements, or checks on a computer screen for engineers to inspect the simulation results.

However, SPICE-like simulation of a whole system becomes more difficult and problematic as the industry continues its relentless trek of scaling down to smaller and smaller device geometries and of cramming more interconnected components into the system. An example of such down scaling is the recent shift from micron-sized channels toward deep submicron sized transistor channel lengths. Because of the smaller device geometries, a circuit designer are able to cram exponentially larger numbers of circuit components (e.g., transistors, diodes, capacitors) into a given integrated circuit (IC), and therefore increases the system to millions of devices. FIG. 1A illustrates an example of such system that may contain millions of devices. As shown in FIG. 1A, the memory circuit includes 64,000 repetitive columns 102, each of the columns includes 512 repetitive rows and each row is represented by a row branch circuit 104 which in turn calls to a leaf circuit 106. All 512 repetitive rows in the column are connected together through a node 108, and each node is driven by a sense amplifier 110.

One approach to represent the increasingly complex system is to use a hierarchical system as shown in FIG. 1B. In the example shown in FIG. 1B, the hierarchical system has a top level (Level 0) instance, which is shown as Level 0 Instance 0 120. The top level instance may include pointers that point to lower level instances, such as Level 1 Instance 0 (122a) and Level 1 Instance K (122b). Each instance in Level 1 may point to lower level instances, such as instances shown as 124a, 124b, 124c, and 124d. Similarly, the hierarchical system may include multiple levels, such as instances 126a, 126b, and 126c in Level J. At the bottom level of the hierarchical system, shown as Level L, the instances may also be referred as leaf instances, such as Leaf Instance 0 (128a), Leaf Instance 1 (128b) and Leaf Instance N (128c). As shown in FIG. 1A and FIG. 1B, as the number of components in the system increases, the amount of data used in naming each circuit instance in the hierarchical data structure can be prohibitively large such that cost and performance of circuit simulation can be adversely affected.

Therefore, there is a need for methods and systems that address the issues of the conventional hierarchical systems described above. More specifically, there is a need for methods and systems that can effectively organize and retrieve names of instances in the hierarchical system.

SUMMARY

Methods and systems are disclosed for naming methodologies for a hierarchical system. In one embodiment, a computer implemented method of organizing instance names in a hierarchical system includes receiving a description of a hierarchical system that includes plurality of instances arranged in different branches in a plurality of hierarchical levels in a physical data structure, creating an instance name data structure configured to describe the corresponding instances in the hierarchical system, where the instance name data structure comprises a map of indexes and a corresponding array of offsets configured to access naming information in a subsequent level, and associating names of instances in the hierarchical system to a corresponding set of unique integers which are arranged in a sequential manner.

In another embodiment, a system for organizing instance names in a hierarchical system includes at least a processor and a naming modeling configured to work with the at least one processor. The naming module includes logic for receiving a description of a hierarchical system that includes plurality of instances arranged in different branches in a plurality of hierarchical levels in a physical data structure, logic for creating an instance name data structure configured to describe the corresponding instances in the hierarchical system, where the instance name data structure comprises a map of indexes and a corresponding array of offsets configured to access naming information in a subsequent level, and logic for associating names of instances in the hierarchical system to a corresponding set of unique integers which are arranged in a sequential manner.

In yet another embodiment, a computer program product includes a non-transitory medium storing computer programs for execution by one or more computer systems. The computer program product further includes code for receiving a description of a hierarchical system that includes plurality of instances arranged in different branches in a plurality of hierarchical levels in a physical data structure, code for creating an instance name data structure configured to describe the corresponding instances in the hierarchical system, where the instance name data structure comprises a map of indexes and a corresponding array of offsets configured to access naming information in a subsequent level, and code for associating names of instances in the hierarchical system to a corresponding set of unique integers which are arranged in a sequential manner.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

DESCRIPTION OF EMBODIMENTS

Naming methodologies for a hierarchical system are provided. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 2:
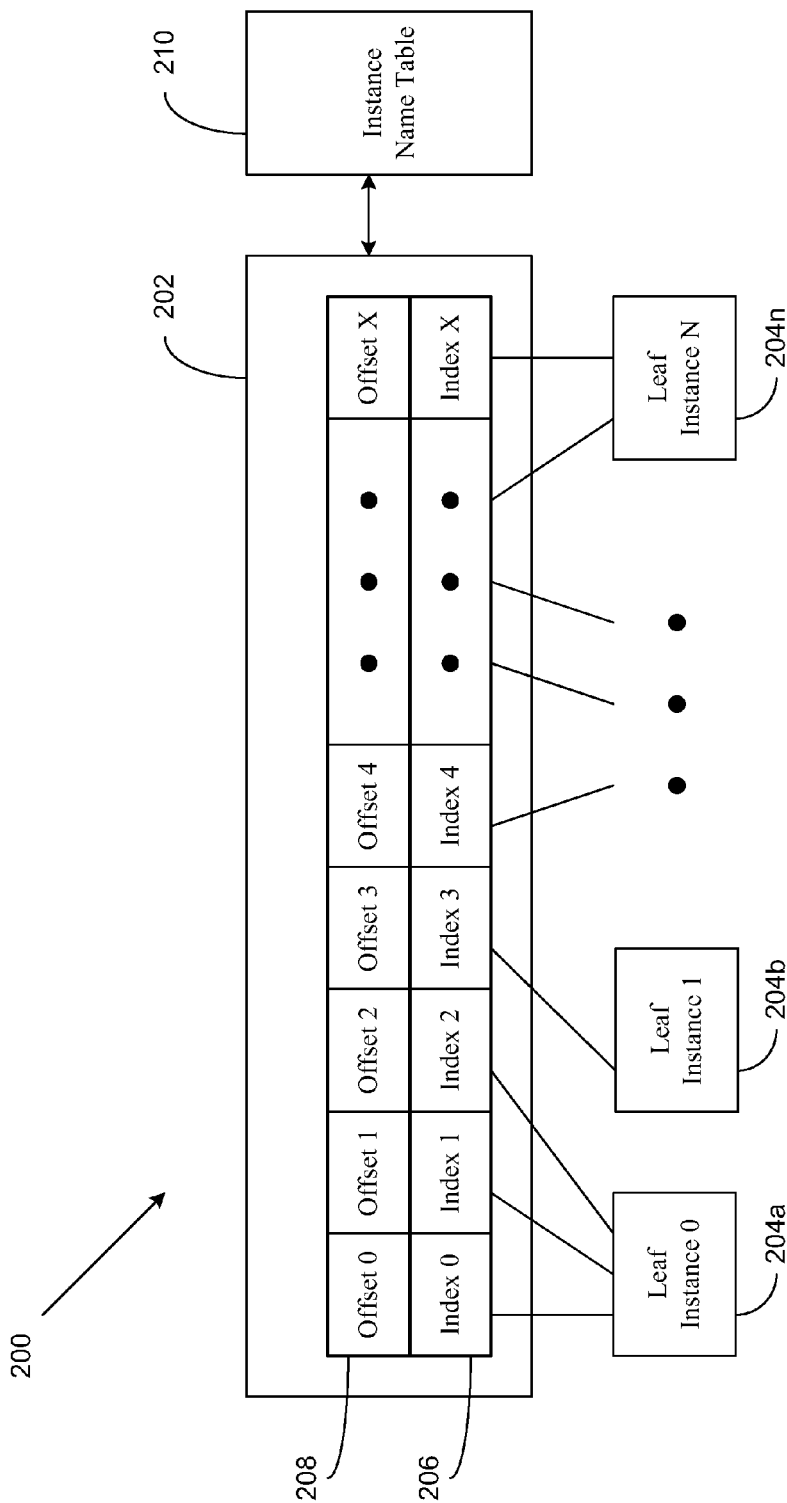
FIG. 2 illustrates a method of organizing instance names in a hierarchical system according to some aspects of the present disclosure.

FIG. 2 illustrates a method of organizing instance names in a hierarchical system according to some aspects of the present disclosure. In the example shown in FIG. 2, the hierarchical system 200 includes two hierarchical levels, namely a top instance 202 and a plurality of leaf instances such as Leaf Instance 0 to Leaf Instance N (204a, 204b, ... 204n). According to embodiments of the present disclosure, the hierarchical system may be represented in an instance name data structure. The top instance 202 includes a map of indexes 206 and a corresponding array of offsets 208. The hierarchical system further includes an Instance Name Table 210, which may be configured to store information of the instances in the hierarchical system.

In the example shown in FIG. 2, the map of indexes includes Index 0 to Index X, where X can be any arbitrary integer. Each index may be configured to enable the hierarchical system to reference or access a lower level instance. For example, Index 0 can be used to access Leaf Instance 0; Index 3 can be used to access Leaf Instance 1, and Index X can be used to access Leaf Instance N. Similarly, the array of offsets includes Offset 0 to Offset X, where X can be any arbitrary integer. Each offset describes the number instances under a branch of the instance name data structure that is referenced by the corresponding index. For example, if Offset 0 equals to 100, which means under the branch referenced by Index 0, there are 100 instances.

According to some aspects of the present disclosure, the example shown in FIG. 2 may be employed to represent topological and physical database of a hierarchical data structure. The top level instance 202 includes a list of indexes that in turn points to lower level instances 204a to 204n. Note that the netlist representing the data structure of FIG. 2 may be configured for reuse. For example, in simulation, a simulator may split or expand the hierarchical data structure so that each instance can get a unique primitive. Splitting the hierarchical data structure is supported because each instance may need to be solved separately due to different input stimuli received at each instance, although some instances are topologically and physically identical.

According to aspects of the present disclosure, a naming tree is used to name the top level instance and its corresponding sub-instances at lower levels. In one exemplary approach, each index (for example Index 0, index 1, and index 2) may include a pointer that points to a topologically and physically identical Leaf Instance 0 204a. The Instance Name Table 210 includes a map/hash table that supports lookup of each index in the array of indexes 206. In some implementations, the array of indexes 206 may be implemented with a list of sequential integers. Also, names of instances referenced by the Instance Name Table 210 may be shared and reused.

Note that in the example shown in FIG. 2, a multi-level hierarchical data structure is flattened to two levels, keeping the bottom level to include leaf instances. This structure provides advantages in the simulation of a repetitive circuit such as a memory array. During certain phases of the simulation, since many or most of the memory cells are inactive, such inactive memory cells may be represented as one sub-circuit instance, which significantly improves efficiency and amount of memory used by the simulator.

Figure 1A:
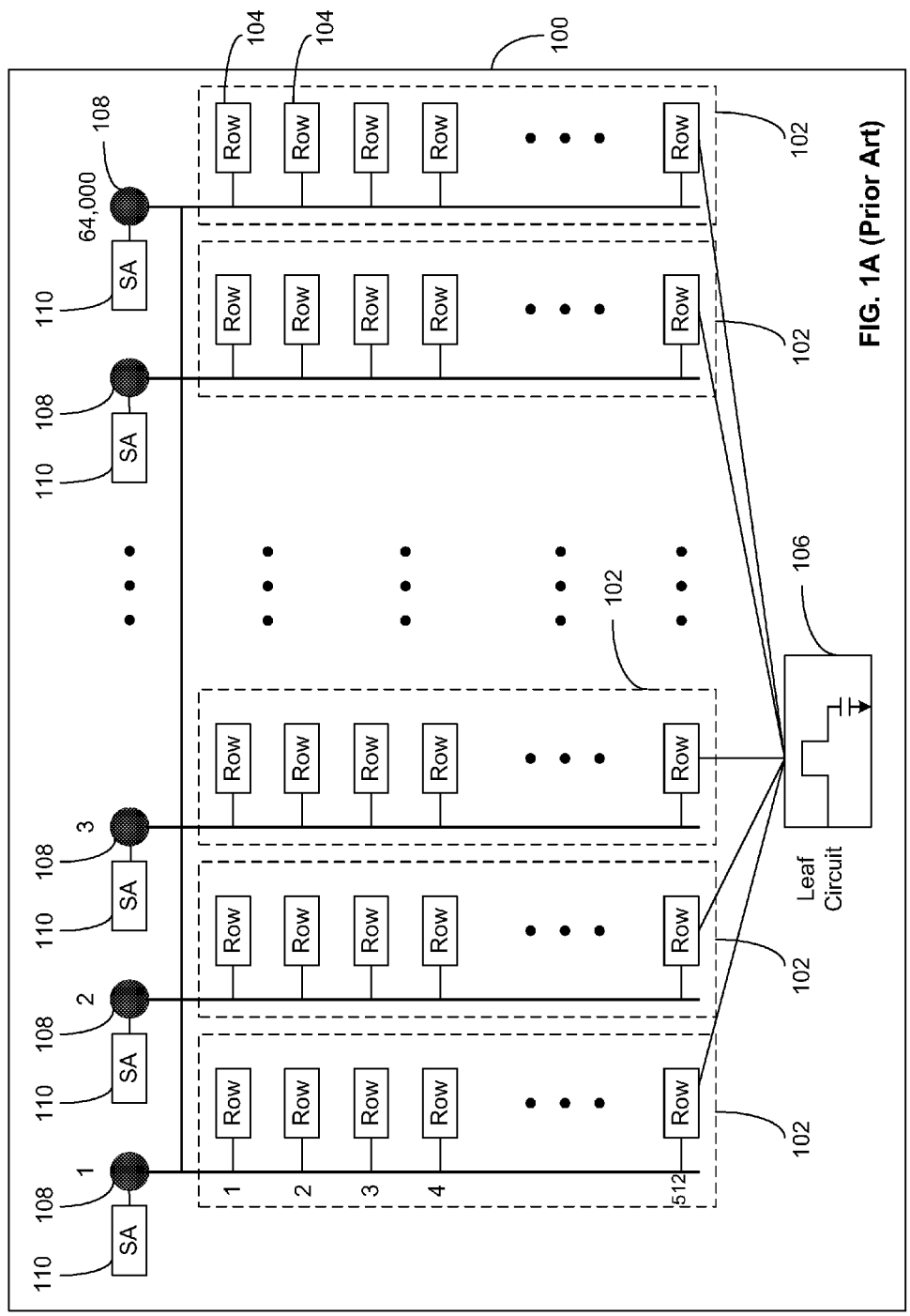
FIG. 1A illustrates a circuit that may be represented in a hierarchical system.
Figure 1B:
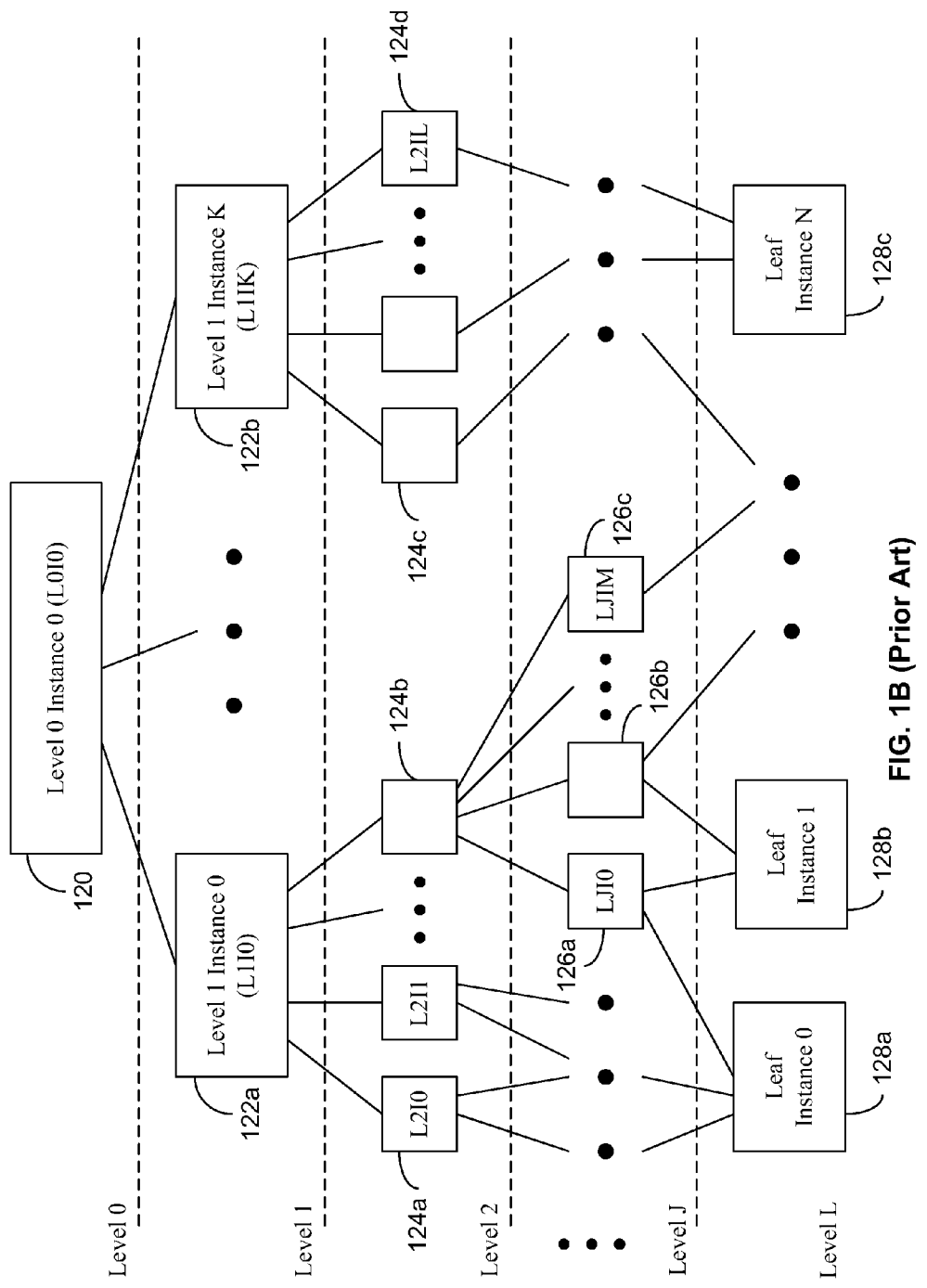
FIG. 1B illustrates a hierarchical data structure that may be used in a hierarchical system.
Figure 4:
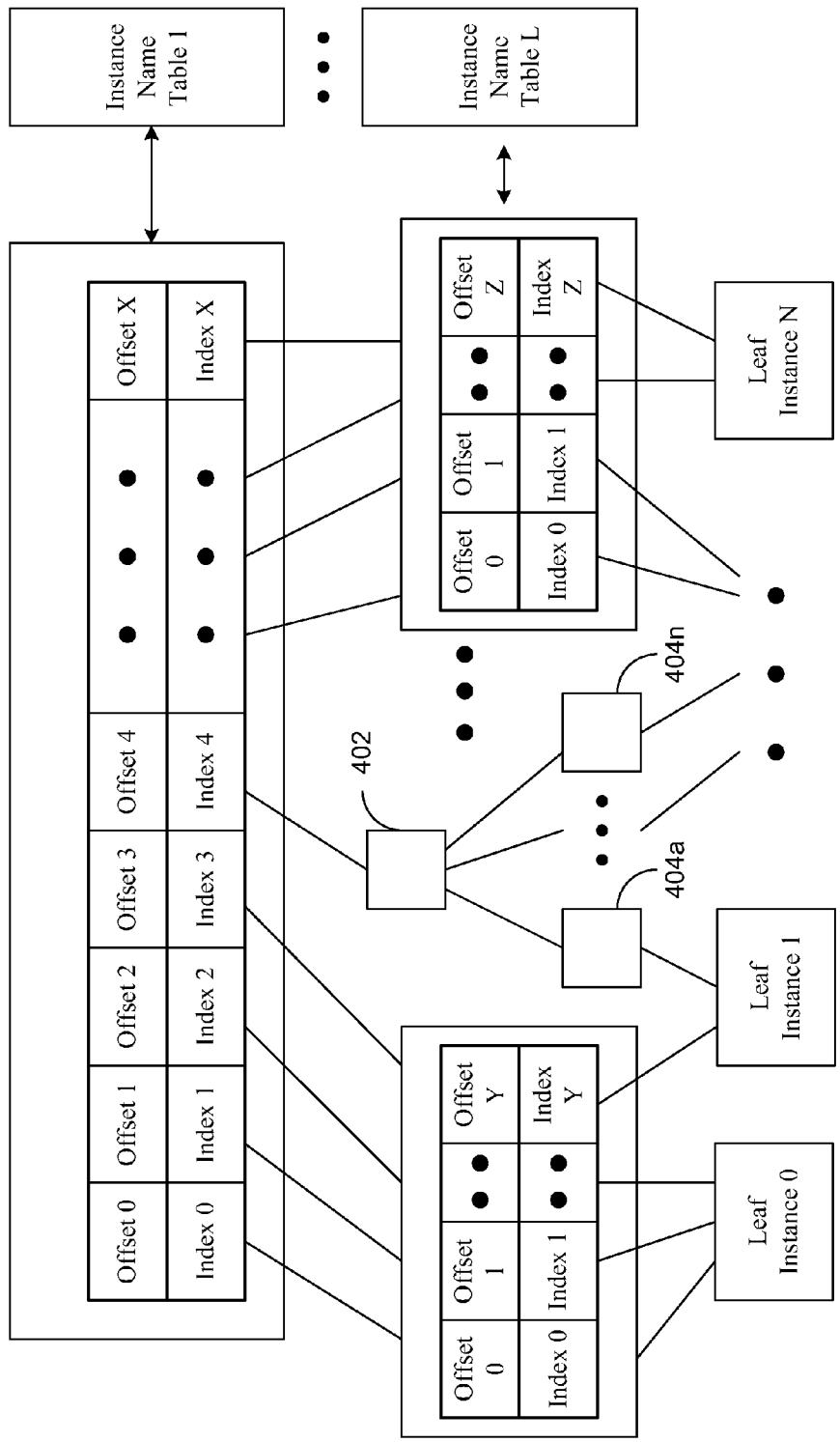
FIG. 4 illustrates yet another method of organizing instance names in a hierarchical system according to some aspects of the present disclosure.
Figure 5:
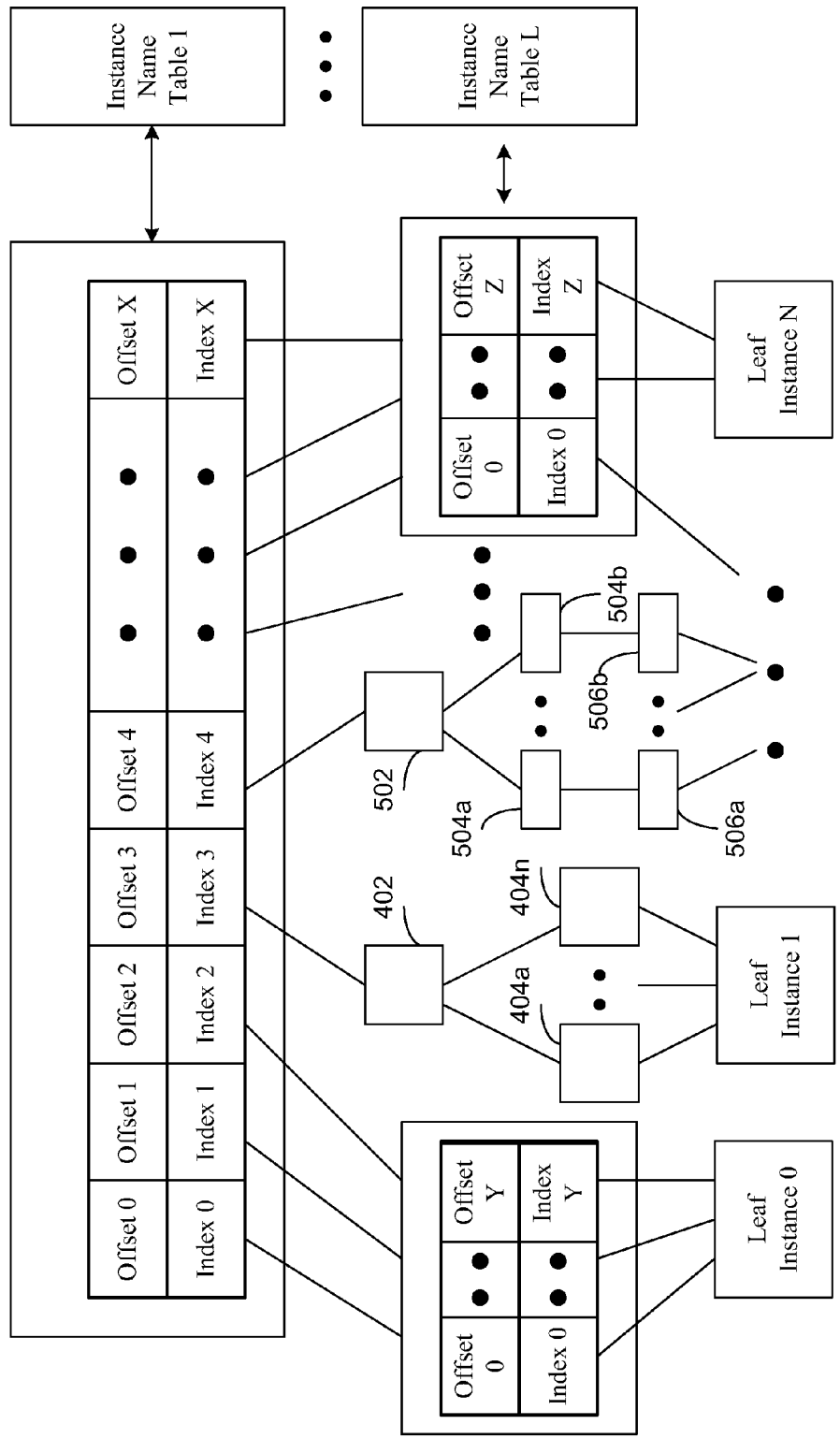
FIG. 5 illustrates yet another method of organizing instance names in a hierarchical system according to some aspects of the present disclosure.

Note that the disclosed method may be applied to various applications, such as the simulation of a highly repetitive circuit of the memory array shown in FIG. 1A. In the example of FIG. 1A, a SRAM can have multiple levels of hierarchy, where each building block can be an instance (primitive). In some implementations, it is desirable to flatten the many hierarchical levels to two levels for circuit simulation. For example, in silicon, the circuit would not know its hierarchy. Thus, a flattened data structure may be a more accurate representation of the circuit in silicon. Note that in topological database, there may be two levels; and in naming, more than two levels may be kept as shown in FIG. 4 and FIG. 5 below.

Figure 3:
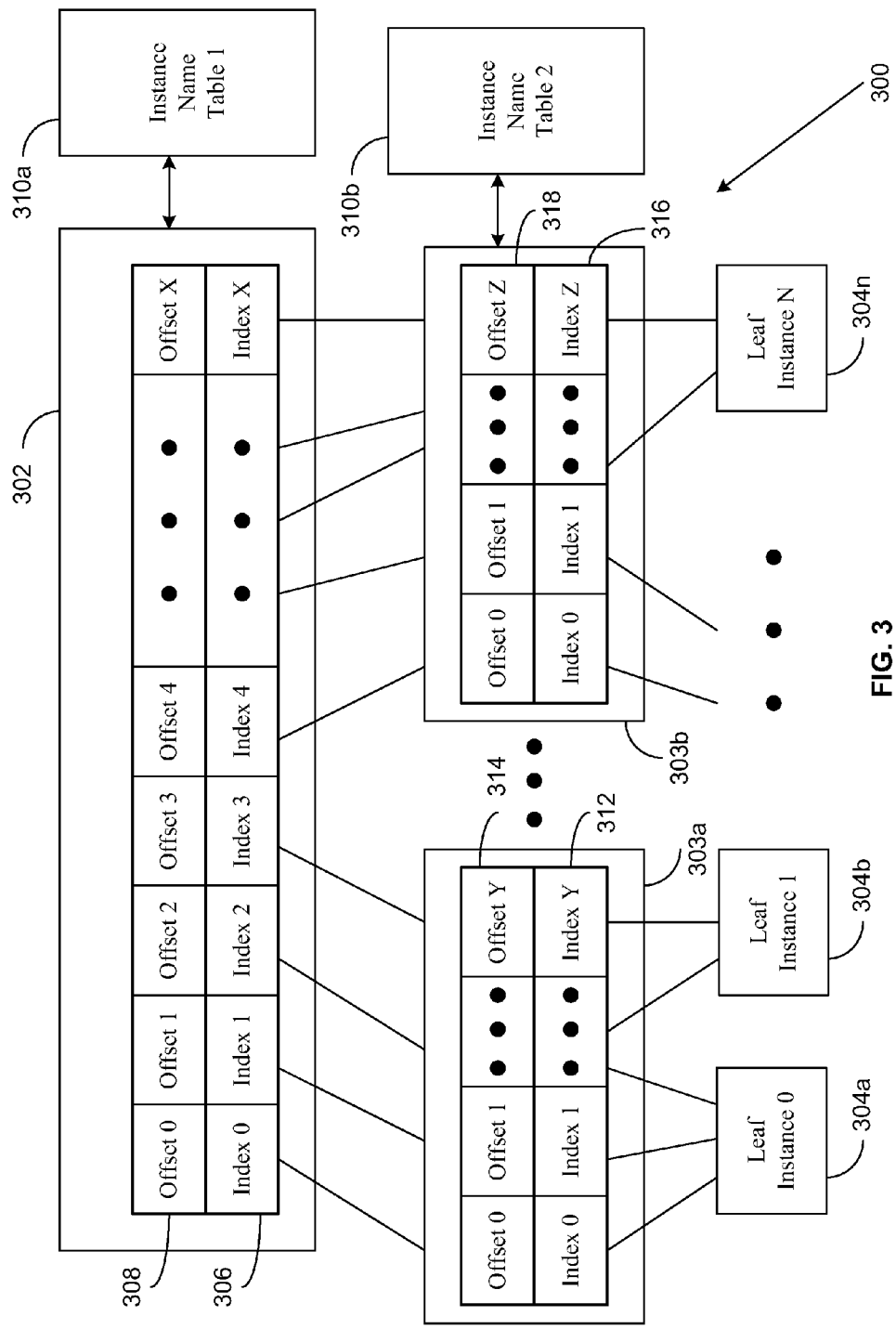
FIG. 3 illustrates another method of organizing instance names in a hierarchical system according to some aspects of the present disclosure.

FIG. 3 illustrates another method of organizing instance names in a hierarchical system according to some aspects of the present disclosure. In the exemplary embodiment shown in FIG. 3, the hierarchical system 300 includes three hierarchical levels, namely a top instance 302, a plurality of lower level instances (shown as 303a to 303b) and a plurality of leaf instances such as Leaf Instance 0 to Leaf Instance N (304a, 304b, . . . 304n). According to embodiments of the present disclosure, the hierarchical system may be represented in an instance name data structure. The top instance 302 includes a map of indexes 306 and a corresponding array of offsets 308. The hierarchical system further includes an Instance Name Table 1 (310a) and Instance Name Table 2 (310b). The Instance Name Table 1 and Instance Name Table 2 may be configured to store information of the instances in the hierarchical system.

In the example shown in FIG. 3, for instance 302, the map of indexes 306 includes Index 0 to Index X, where X can be any arbitrary integer. Each index may be configured to enable the hierarchical system to reference or access a lower level instance. For example, Index 0 to Index 3 can be used to access instance 303a; and Index 4 to Index X can be used to access instance 303b. Similarly, for instance 302, the array of offsets includes Offset 0 to Offset X, where X can be any arbitrary integer. Each offset describes the number instances under a branch of the instance name data structure that is referenced by the corresponding index. For example, if Offset X equals to 200, which means under the branch referenced by Index X, in this case being instance 303b and its lower level leaf instances, there are 200 instances.

For Instance 303a, a map of indexes 312 includes Index 0 to Index Y, where Y can be any arbitrary integer. Each index may be configured to enable the hierarchical system to reference or access a lower level instance. For example, Index 0 can be used to access Leaf Instance 0 (304a); and Index Y can be used to access Leaf Instance 1 (304b). Also, for instance 303a, the array of offsets 314 includes Offset 0 to Offset Y.

Each offset describes the number instances under a branch of the instance name data structure that is referenced by the corresponding index.

Similarly, For Instance 303b, a map of indexes 316 includes Index 0 to Index Z, where Z can be any arbitrary integer. Each index may be configured to enable the hierarchical system to reference or access a lower level instance. For example, Index Z can be used to access Leaf Instance N (304n). Also, for instance 303b, the array of offsets 318 includes Offset 0 to Offset Z. Each offset describes the number instances under a branch of the instance name data structure that is referenced by the corresponding index. In this case, Offset Z equals to the number of instances contained in Leaf Instance N.

FIG. 3 shows an exemplary 3-level hierarchical data structure with shared Instance Name Table(s), such as Instance Name Table 1 310a and Instance Name Table 2 310b. One benefit of separating the instance name tables (shown as Instance Name Table 1 310a and Instance Name Table 2 310b) from the topological database is that it may be used to show compressed name maps of each instance (also referred to as primitive in circuit simulation). For example, instance of having one copy for every instance, the disclosed system may be configured to share a name of an instance with other instance in the hierarchical data structure. In conventional system, a name of an instance that carries information about multiple hierarchical levels can be very long. In the current disclosure, instead of using name maps for each instance, a name of an instance may be represented in terms of indexes and their corresponding offsets represented in integers, which gives significant compression of a circuit simulation database.

According to some aspects of the present disclosure, multiple instances can be shared in an Instance Name Table, such as 310a. For example, given an instance name X1.XA.XBB, for each level of the name, the system can be configured to lookup the index associated with an instance (for example X1) in the shared primitive name map. Then, the index can be used in the next level, and the process continues until all the levels in the name have been reached. In this example, at the level X1, offset associated with X1 is obtained; then the method may go down to the next level XA and obtains the offset associated with XA; then the method may go down to the next lower level XBB and obtains the offset associated with XBB, until all the levels have been reached. The integer computed by summation of all the offsets (associated with X1, XA, and XBB) may be used as a pointer that points to information associated with the instance name X1.XA.XBB.

Note that using the exemplary approach described above, the data size associated with names in the hierarchical data structure can be compressed significantly. For example, in a conventional system, each entry can be approximately 100 bytes (size of the pointer+size of the name). With the present disclosure, the size per entry in the array of indexes can be approximately 8 bytes, which give a more than ten time in data compression. In simulating a complex integrated circuit, the disclosed method may reduce a 20 Gigabytes name table (using conventional method) to 2 Gigabytes, which can be a manageable size for most simulators.

According to aspects of the present disclosure, the system may be configured to be able to lookup an instance in the hierarchical data structure. One approach is to assign a group of sequential integers to each branch in the hierarchical data structure in a depth first, left to right, and top to bottom manner. In some implementations, the first instance may be assigned a predetermined number, such as 0, 100, or 10,000.

In the example shown in FIG. 3, assume there are 100 instances. Two elements are stored for each instance, namely an index to the next level and an offset of where the instance may begin at the next level. This means that after each instance in the entire hierarchical data structure is assigned a numerical label, each instance has an associated range. The first instance (referenced by index 0) may have a range from 0 to 99; the next instance (referenced by index 1) may have a range from 100 to 199. These ranges are captured by the list of corresponding offsets 308 (from Offset 0 to Offset X). Each offset indicates a starting number of an instance in a lower level. For example Offset 3 indicates the starting number for instance 303*a*, which is referenced by the Index 3. Similarly, Offset 4 indicates the starting number for instance 303*b*, which is referenced by the Index 4.

According to some aspects of the present disclosure, give an instance name X3.XE.XAA, to compute the offset for accessing information of the instance, the system may be configured to first lookup X3 and retrieve its corresponding offset; then the lookup XE and its corresponding offset; then lookup XAA and its corresponding offset. The summation of all the offsets of X3, XE, and XAA would provide the index to lookup the instance in the topological and physical database. A similar methodology may be employed to determine an index to lookup an instance in the instance name data structure.

For another example, given a hierarchical data structure of size 100×100×100, there are 1 million entries in this hierarchical structure (100 instances in the first level, each instance points to 100 instances in the second level, and each instance in the second level points to 100 instances in the third level). To represent this hierarchical data structure in a name table, a conventional method may take approximately 108 Mbytes (100 bytes for each entry+8 bytes for each array pointer). According to aspects of the present disclosure, the same hierarchical data structure may be represented by using 100× 100 bytes for the name table, and 100×8×2 bytes for the array of offset and pointers, which is approximately 34 Kbytes. As a result, a significant amount of data compression has been achieved.

Note that the disclosed method changes the multiplication relationship to a summation relationship in the use of data for storing the names of instances in the hierarchical data structure. This is because the instances are labeled and ordered sequentially. In this approach, the integer labels used in the ordering encode the names of instances in the data structure. One approach to order the instances may be done sequentially in a depth first, left to right, and top to bottom manner. Another approach to order the instance may be done sequentially in a depth first, right to left, and bottom up manner.

FIG. 4 illustrates yet another method of organizing instance names in a hierarchical system according to some aspects of the present disclosure. Note that portions of FIG. 4 are similar to that of FIG. 3, and such similar features are not repeated in the following descriptions. According to embodiments of the present disclosure, the exemplary implementation of FIG. 4 allows customization of a portion of the system to have a different hierarchical data structure than the rest of the system. In this example, Index 4 is used to reference the portion of the system that includes the different hierarchical data structure. The portion of the system includes instance 402 and a plurality of instances 404*a* to 404*n*, which are referenced by instance 402. Each of the instance, namely 402, 404*a* or 404*n*, includes a corresponding map of indexes and a corresponding array of offsets as described previously in association with FIG. 3. In addition, the system may include a plurality of instance name tables, namely Instance Name Table 1 to Instance Name Table L, that are configured to store information of the hierarchical system. Note that the system of FIG. 4 can be configured to support partial flattened cases in circuit simulation.

As shown in the example of FIG. 4, the hierarchy of one of the instance (primitive) may be kept. This approach may be used to support applications where one hierarchy of an instance is kept and all other instances in the hierarchical data structure are flattened out. In this example, Offset 4 would keep track of the number of instances referenced by Index 4, i.e. all instances under 402. Note that sharing of instances (Left Instance 1 as shown in FIG. 4) may still be supported among the flattened instances and the instances which have kept the hierarchical data structure.

FIG. 5 illustrates yet another method of organizing instance names in a hierarchical system according to some aspects of the present disclosure. Note that portions of FIG. 5 are similar to that of FIG. 4, and such similar features are not repeated in the following descriptions. According to embodiments of the present disclosure, the exemplary implementation of FIG. 5 allows multiple sections of the system to have different hierarchical data structures than the rest of the system. A first section of the system includes instance 402 and a plurality of instances 404*a* to 404*n*, which are referenced by instance 402. A second section of the system includes instance 502, 504*a* to 504*b*, and 506*a* to 506*b*. Note that the multiple sections of the system can have different hierarchical data structures. In this example, the first section and the second section have different hierarchical data structures. In addition, the system may include a plurality of instance name tables, namely Instance Name Table 1 to Instance Name Table L, that are configured to store information of the hierarchical system. Note that the system of FIG. 5 can be configured to support partial flattened cases and customization of different hierarchical data structures in circuit simulation.

According to aspects of the present disclosure, the instance name tables (shown as Instance Name Table 1 to Instance Name Table L) may be shared by instances in different levels of the hierarchical data structure. To share instances in the instance name tables, the instances will have the same naming scheme. For example, a 1 Gigabit DRAM may have 100 different sub-circuits (leaf instances), and each of the sub-circuit may have identical naming scheme within the sub-circuit.

For instance, within a leaf circuit (such as inside an inverter), there may be transistor 1, transistor 2, input port, output port, etc.; all these names can be fixed within the inventor. In a circuit there thousands of inverters, they may all be named the same way. Note that, inside an instance, the labels need to be assigned sequentially as well. The multiple levels of sequentially arranged instances enable an efficient lookup scheme. Also note that the shared instances do not have to be at the same level of the hierarchical data structure.

Note that the instance name tables may be shared if an instance to be shared has the same name. For example, if bank 1 and bank 2 of a DRAM may have different naming scheme, their names cannot be shared. On the other hand, if an inverter is used a thousand times with the same name, it can be shared.

Figure 6:
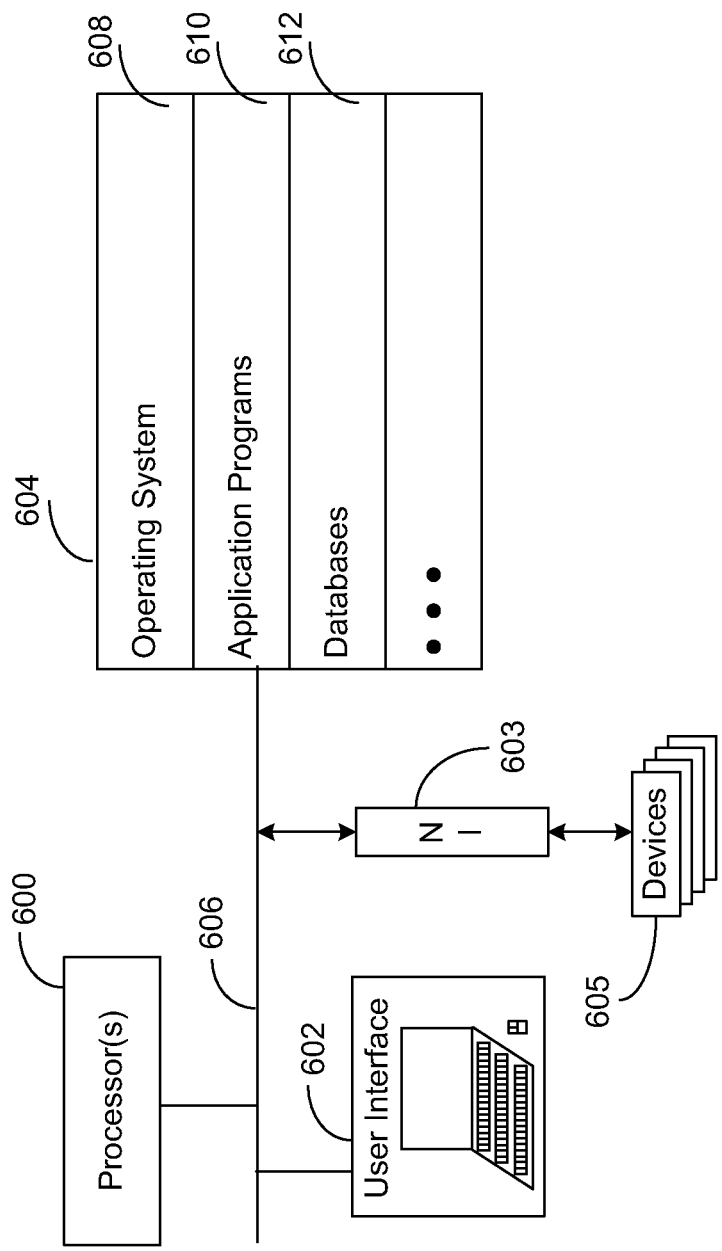
FIG. 6 illustrates a system for organizing instance names in a hierarchical system according to some aspects of the present disclosure.

FIG. 6 illustrates a system for organizing instance names in a hierarchical system according to some aspects of the present disclosure. In one embodiment, the methodologies for naming a hierarchical system may be implemented using a computer system. The computer system may include one or more graphics processing units (GPUs) and/or central processing units (CPUs) 600, at least a user interface 602 for displaying computation results and waveforms, a memory device 604, a system bus 606, and one or more bus interfaces for connecting the GPUs/CPUs, user interface, memory device, and system bus together. The computer system also includes at least one network interface 603 for communicating with other devices 605 on a computer network. In alternative embodiments, certain functionalities of the method and system may be implemented in one or more application-specific integrated circuits (ASICs) or field-programmable gate arrays (FPGAs), thereby reducing the role of the GPU/CPU.

The memory device 604 may include high-speed random-access memory and may also include non-volatile memory, such as one or more magnetic disk storage devices. The memory device may also include mass storage that is located remotely from the GPUs/CPUs. The memory device preferably stores:

- an operating system 608 that includes procedures for handling various basic system services and for performing hardware-dependent tasks;
- application programs 610 for performing other user-defined applications and tasks, such as circuit simulations and device evaluations;
- databases 612 for storing information of the hierarchical data structure, the databases include instance name table, data structures, device models, and matrices.

The databases, the application programs, and the program for implementing a parallel matrix solver for circuit simulation may include executable procedures, sub-modules, tables, and other data structures. In other embodiments, additional or different modules and data structures may be used, and some of the modules and/or data structures listed above may not be used.

Figure 7:
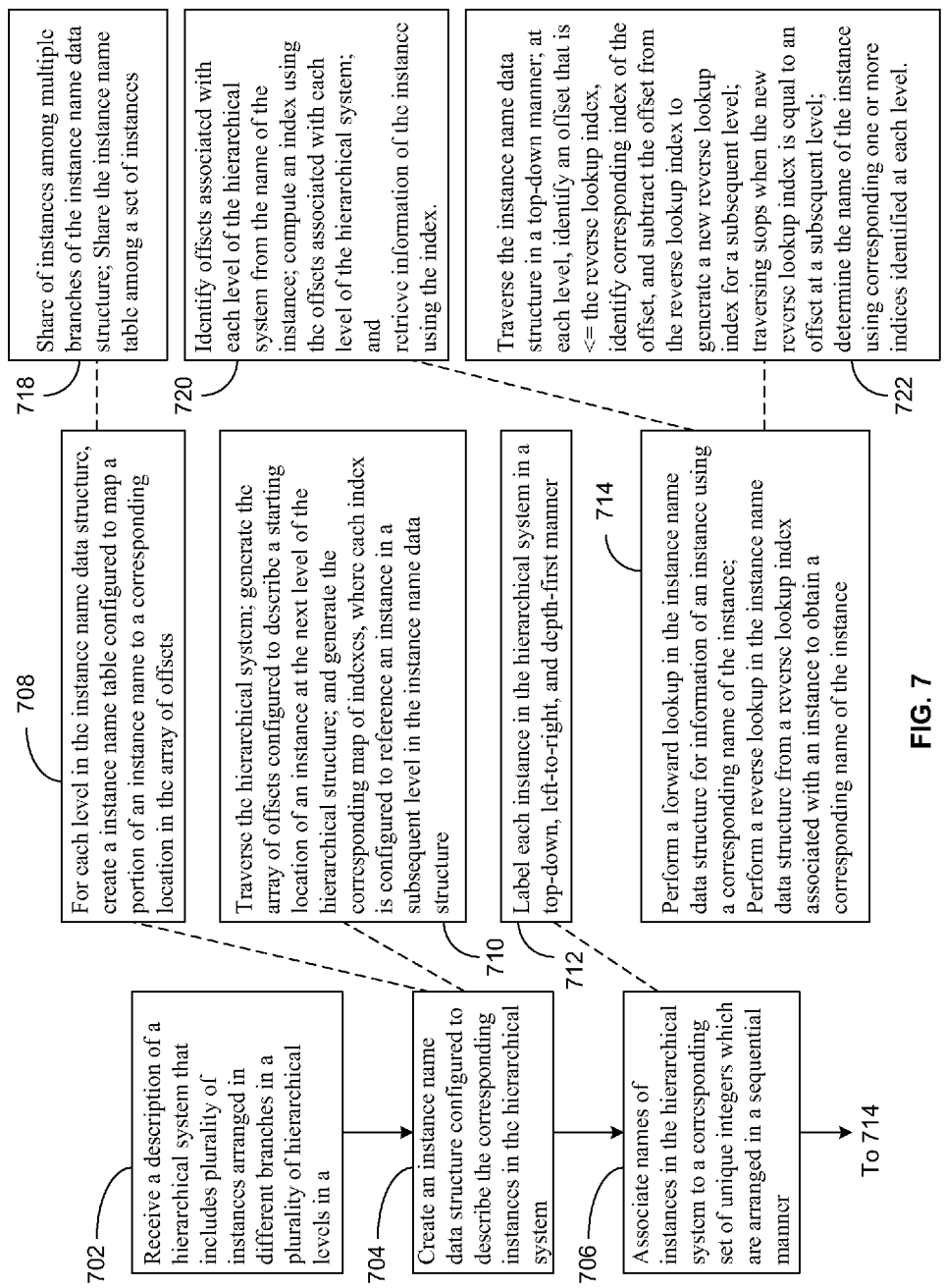
FIG. 7 illustrates an exemplary flow chart implemented by the system of FIG. 6 according to some aspects of the present disclosure.

FIG. 7 illustrates an exemplary flow chart implemented by the system of FIG. 6 according to some aspects of the present disclosure. In block 702, the system can include logic configured to receive a description of a hierarchical system, where the hierarchical system includes plurality of instances arranged in different branches in a plurality of hierarchical levels. In block 704, the system can include logic configured to create an instance name data structure configured to describe the corresponding instances in the hierarchical system, where the instance name data structure comprises a map of indexes and a corresponding array of offsets configured to access naming information in a subsequent level. In block 706, the system can include logic configured to associate names of instances in the hierarchical system to a corresponding set of unique integers, where the corresponding set of unique integers are arranged in a sequential manner. In some implementations, the subsequent level may comprise only leaf instances of the hierarchical system. In some other implementations, the subsequent level may comprise a combination of a set of leaf instances and a set of instances having at least one hierarchical level.

According to embodiments of the present disclosure, the logic implemented in block 704 may further include logic described in blocks 708, 710 and 718. For example, in block 708, for each level in the instance name data structure, the system can include logic configured to create an instance name table configured to map a portion of an instance name to a corresponding location in the array of offsets.

In block 710, the system can include logic configured to traverse the hierarchical system, generate the array of offsets configured to describe a starting location of an instance at the next level of the hierarchical structure, and generate the corresponding map of indexes, where each index is configured to reference an instance in a subsequent level in the instance name data structure.

In block 718, the system can include logic configured to share of instances among multiple branches of the instance name data structure and share the instance name table among a set of instances.

According to embodiments of the present disclosure, the logic implemented in block 706 may further include logic described in blocks 712. In block 712, the system can include logic configured to label each instance in the hierarchical system in a top-down, left-to-right, and depth-first manner.

In block 714, the system may further include logic configured to perform at least one of a forward lookup in the instance name data structure for information of an instance using a corresponding name of the instance, and to perform a reverse lookup in the instance name data structure from a reverse lookup index associated with an instance to obtain a corresponding name of the instance. The logic in block 714 may further include logic in block 720 and block 722. In block 720, the system may be configured to identify offsets associated with each level of the hierarchical system from the name of the instance, compute an index using the offsets associated with each level of the hierarchical system, and retrieve information of the instance using the index. In block 722, the system may be configured to traverse the instance name data structure in a top-down manner. At each level, the system may be configured to identify an offset that is less than or equal to the reverse lookup index, where the offset has a value closest to the reverse lookup index comparing to other offsets, identify corresponding index of the offset, and subtract the offset from the reverse lookup index to generate a new reverse lookup index for a subsequent level, end traversing the instance name data structure in response to the new reverse lookup index is equal to an offset at a subsequent level; and determine the name of the instance using corresponding indices identified at each level.

According to some aspects of the present disclosure, the system may be configured to compress the instance names in the hierarchical data structure. In particular, the system may be configured to lookup information of an instance by name. In addition, the system may be configured regenerate the name of the instance given the index that is used to access information of the instance. In other words, the system can be configured to perform a forward lookup using a name of an instance or to perform a reverse lookup of the name of an instance given a global index associated with the instance using relatively efficient computation methods described above. For example, the system may be configured to perform a forward lookup in the physical data structure for information of an instance using a corresponding name of the instance. Alternatively, the system may be configured to perform a reverse lookup in the physical data structure from an index associated with an instance to obtain a corresponding name of the instance.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A computer implemented method of organizing instance names in a hierarchical system, comprising:
    receiving a description of a hierarchical system, wherein the hierarchical system includes plurality of instances arranged in different branches in a plurality of hierarchical levels in a physical data structure;
    creating an instance name data structure configured to describe the plurality of instances in the hierarchical system, wherein the instance name data structure comprises a map of indexes and an array of offsets configured to access naming information in a subsequent level, wherein the creating the instance name data structure further comprises: traversing the hierarchical system; generating the array of offsets configured to describe a starting location of an instance at a next level of the hierarchical system; and generating a corresponding map of indexes, wherein each index is configured to reference an instance in a subsequent level in the instance name data structure; and
    associating names of instances in the hierarchical system to a corresponding set of unique integers, wherein the corresponding set of unique integers are arranged in a sequential manner.

2. The computer implemented method of claim 1, wherein creating the instance name data structure further comprises:
    for each level in the instance name data structure, creating an instance name table configured to map a portion of an instance name to a corresponding location in the array of offsets.

3. The computer implemented method of claim 2, wherein creating the instance name data structure further comprises:
    sharing of instances among multiple branches of the instance name data structure; and
    sharing the instance name table among a set of instances.

4. The computer implemented method of claim 1, wherein associating names of instances in the hierarchical system to a corresponding set of unique integers comprises:
    labeling each instance in the hierarchical system in a top-down, left-to-right, and depth-first manner.

5. The computer implemented method of claim 1, wherein the subsequent level comprises at least one of:
    only leaf instances of the hierarchical system; and
    a combination of a set of leaf instances and a set of instances having at least one hierarchical level.

6. The computer implemented method of claim 1, further comprising at least one of:
    performing a forward lookup in the instance name data structure for information of an instance using a name of the instance; and
    performing a reverse lookup in the instance name data structure from a reverse lookup index associated with an instance to obtain the name of the instance.

7. The computer implemented method of claim 6, wherein performing a forward lookup comprises:
    identifying offsets associated with each level of the hierarchical system from the name of the instance;
    computing a forward lookup index using the offsets associated with each level of the hierarchical system; and
    retrieving information of the instance using the forward lookup index.

8. The computer implemented method of claim 6, wherein performing a reverse lookup comprises:
    traversing the instance name data structure in a top-down manner;
    at each level, identifying an offset that is less than or equal to the reverse lookup index wherein the offset has a value closest to the reverse lookup index comparing to other offsets, identifying corresponding index of the offset, and subtracting the offset from the reverse lookup index to generate a new reverse lookup index for a subsequent level; ending traversing the instance name data structure in response to the new reverse lookup index is equal to an offset at a subsequent level; and
    determining the name of the instance using corresponding one or more indices identified at each level.

9. The computer implemented method of claim 1, further comprising at least one of:
    performing a forward lookup in the physical data structure for information of an instance using a name of the instance; and
    performing a reverse lookup in the physical data structure from an index associated with an instance to obtain the name of the instance.

10. A computer program product comprising a non-transitory medium storing computer programs for execution by one or more computer system, the computer program product comprising:
    code for receiving a description of a hierarchical system, wherein the hierarchical system includes plurality of instances arranged in different branches in a plurality of hierarchical levels in a physical data structure;
    code for creating an instance name data structure configured to describe the plurality of instances in the hierarchical system, wherein the instance name data structure comprises a map of indexes and an array of offsets configured to access naming information in a subsequent level, wherein the code for creating the instance name data structure further comprises: code for traversing the hierarchical system; code for generating the array of offsets configured to describe a starting location of an instance at a next level of the hierarchical system; and code for generating a corresponding map of indexes, wherein each index is configured to reference an instance in a subsequent level in the instance name data structure; and
    code for associating names of instances in the hierarchical system to a corresponding set of unique integers, wherein the corresponding set of unique integers are arranged in a sequential manner.

11. The computer program product of claim 10, wherein code for creating the instance name data structure further comprises:
    for each level in the instance name data structure, code for creating an instance name table configured to map a portion of an instance name to a corresponding location in the array of offsets.

12. The computer program product of claim 11, wherein code for creating the instance name data structure further comprises:
    code for sharing of instances among multiple branches of the instance name data structure; and
    code for sharing the instance name table among a set of instances.

13. The computer program product of claim 10, wherein code for associating names of instances in the hierarchical system to a corresponding set of unique integers comprises:
    code for labeling each instance in the hierarchical system in a top-down, left-to-right, and depth-first manner.

14. The computer program product of claim 10, wherein the subsequent level comprises at least one of:
    only leaf instances of the hierarchical system; and
    a combination of a set of leaf instances and a set of instances having at least one hierarchical level.

15. The computer program product of claim 10, further comprising at least one of:
    code for performing a forward lookup in the instance name data structure for information of an instance using a name of the instance; and
    code for performing a reverse lookup in the instance name data structure from a reverse lookup index associated with an instance to obtain the name of the instance.

16. The computer program product of claim 15, wherein code for performing a forward lookup comprises:
    code for identifying offsets associated with each level of the hierarchical system from the name of the instance;
    code for computing a forward lookup index using the offsets associated with each level of the hierarchical system; and
    code for retrieving information of the instance using the forward lookup index.

17. The computer program product of claim 15, wherein code for performing a reverse lookup comprises:
    code for traversing the instance name data structure in a top-down manner;
    at each level, code for identifying an offset that is less than or equal to the reverse lookup index wherein the offset has a value closest to the reverse lookup index comparing to other offsets, code for identifying corresponding index of the offset, and subtracting the offset from the reverse lookup index to generate a new reverse lookup index for a subsequent level; ending traversing the instance name data structure in response to the new reverse lookup index is equal to an offset at a subsequent level; and
    code for determining the name of the instance using corresponding one or more indices identified at each level.

18. The computer program product of claim 10, further comprising at least one of:
    code for performing a forward lookup in the physical data structure for information of an instance using a name of the instance; and
    code for performing a reverse lookup in the physical data structure from an index associated with an instance to obtain the name of the instance.

19. A system, comprising:
    at least one processor; and
    a naming module configured to work with the at least one processor, wherein the naming module includes:
    logic for receiving a description of a hierarchical system, wherein the hierarchical system includes plurality of instances arranged in different branches in a plurality of hierarchical levels in a physical data structure;
    logic for creating an instance name data structure configured to describe the plurality of instances in the hierarchical system, wherein the instance name data structure comprises a map of indexes and a corresponding array of offsets configured to access naming information in a subsequent level, wherein the logic for creating the instance name data structure further comprises: logic for traversing the hierarchical system; logic for generating the array of offsets configured to describe a starting location of an instance at a next level of the hierarchical system; and logic for generating a corresponding map of indexes, wherein each index is configured to reference an instance in a subsequent level in the instance name data structure; and
    logic for associating names of instances in the hierarchical system to a corresponding set of unique integers, wherein the corresponding set of unique integers are arranged in a sequential manner.

* * * * *